United States Patent
Liu et al.

(10) Patent No.: US 12,278,511 B2
(45) Date of Patent: Apr. 15, 2025

(54) BATTERY SWITCH ON CIRCUIT AND LITHIUM BATTERY

(71) Applicant: PYLON TECHNOLOGIES, CO. LTD, Shanghai (CN)

(72) Inventors: Ming Liu, Shanghai (CN); Lu Shi, Shanghai (CN); Jinfeng Xiang, Shanghai (CN); Xiaoyin Cao, Shanghai (CN)

(73) Assignee: PYLON TECHNOLOGIES, CO. LTD, Shanghai (CN)

( * ) Notice: Subject to any disclaimer, the term of this patent is extended or adjusted under 35 U.S.C. 154(b) by 317 days.

(21) Appl. No.: 17/788,398

(22) PCT Filed: May 19, 2020

(86) PCT No.: PCT/CN2020/091100
§ 371 (c)(1),
(2) Date: Jun. 23, 2022

(87) PCT Pub. No.: WO2021/128711
PCT Pub. Date: Jul. 1, 2021

(65) Prior Publication Data
US 2023/0025702 A1    Jan. 26, 2023

(30) Foreign Application Priority Data

Dec. 26, 2019 (CN) .......................... 201911366543.4
Dec. 26, 2019 (CN) .......................... 201922381615.4

(51) Int. Cl.
*H02J 7/00* (2006.01)
*G06F 1/26* (2006.01)
(Continued)

(52) U.S. Cl.
CPC ............ *H02J 7/0063* (2013.01); *G06F 1/263* (2013.01); *G06F 1/3287* (2013.01); *H02J 7/0031* (2013.01); *H03K 17/223* (2013.01)

(58) Field of Classification Search
CPC ...... H02J 7/0063; H02J 7/0031; H02J 7/0036; G06F 1/263; G06F 1/3287; G06F 1/26;
(Continued)

(56) References Cited

U.S. PATENT DOCUMENTS 4,649,880 A * 3/1987 Asano ................... F02D 11/10
                                                    123/198 DB
6,040,682 A * 3/2000 Kaneda ................. H02J 7/0031
                                                    320/135

(Continued)

FOREIGN PATENT DOCUMENTS

CN    202133884    2/2012
CN    106383478    2/2017
(Continued)

OTHER PUBLICATIONS

China National Intellectual Property Administration, International Search Report, Sep. 29, 2020, 22 pages, Beijing China.

*Primary Examiner* — Daniel Kessie
*Assistant Examiner* — Brian K Baxter
(74) *Attorney, Agent, or Firm* — Hahn Loeser & Parks LLP

(57) ABSTRACT

Embodiments of the present invention disclose a battery switch on circuit and a lithium battery. The circuit includes a communication control module, a relay, a communication control circuit, a switch, and a communication connection terminal. A communication signal terminal of the communication control module is connected to a first contact of the relay, a common contact of the relay is connected to the communication connection terminal. A coil of the relay is powered on to control the common contact and the first (Continued)

contact to be gated and is powered down to control the common contact and a second contact of the relay to be gated. The communication connection terminal is configured to connect to an upper computer. The switch includes a first terminal, a second terminal, and a control terminal. A signal from the control terminal of the switch is capable of controlling conduction or disconnection between the first terminal and the second terminal. The first terminal of the switch is connected to a power supply, the second terminal of the switch is connected to a power input terminal, and after the power input terminal is powered on, the coil of the relay is powered on. A signal input terminal is connected to the second contact of the relay, and a control signal output terminal is connected to the control terminal of the switch. Whereby, an effect of normal power-on and communication after the entire circuit is powered off is realized.

11 Claims, 2 Drawing Sheets

(51) Int. Cl.
    *G06F 1/3287* (2019.01)
    *H03K 17/22* (2006.01)
(58) Field of Classification Search
    CPC ............ H03K 17/223; H03K 17/7955; H01H 2300/022
    See application file for complete search history.

(56) References Cited

U.S. PATENT DOCUMENTS

| | | | | | |
|---|---|---|---|---|---|
| 6,388,468 | B1* | 5/2002 | Li | ...................... | H03K 17/7955 327/333 |
| 8,242,637 | B2* | 8/2012 | Chen | ..................... | H02J 9/06 307/85 |
| 9,825,273 | B2* | 11/2017 | Dulle | .................. | H01M 50/569 |
| 10,326,267 | B2* | 6/2019 | Crispim | ................ | H02J 7/0034 |
| 10,651,662 | B2* | 5/2020 | Lee | ....................... | H02J 7/0031 |
| 11,208,007 | B2* | 12/2021 | Kumeuchi | ............ | H02J 7/0025 |
| 2006/0012933 | A1* | 1/2006 | Bowman | ................ | H02H 1/06 361/93.6 |
| 2006/0152224 | A1* | 7/2006 | Kim | ..................... | G01R 31/392 324/430 |
| 2006/0192663 | A1* | 8/2006 | Bryan | ................. | B60R 16/0315 340/457.1 |
| 2008/0195874 | A1* | 8/2008 | Zhou | ...................... | H02J 9/005 713/320 |
| 2012/0200968 | A1* | 8/2012 | Altemose | ........... | G01R 31/2827 361/86 |
| 2013/0200698 | A1* | 8/2013 | Kuno | ........................ | H02J 4/00 307/10.6 |
| 2014/0062413 | A1* | 3/2014 | Kim | ...................... | H02J 7/0031 320/128 |
| 2014/0105757 | A1* | 4/2014 | Maass | .................... | H02M 3/00 417/44.1 |
| 2014/0197777 | A1* | 7/2014 | Tong | ..................... | H02J 7/0019 429/120 |
| 2016/0099591 | A1* | 4/2016 | Lee | ........................ | H02J 7/0031 320/162 |
| 2016/0134160 | A1* | 5/2016 | Schultz | ................. | H02J 7/0019 307/77 |
| 2018/0358662 | A1* | 12/2018 | Kurosaki | ............ | H01M 10/425 |
| 2019/0067957 | A1* | 2/2019 | Yeom | ..................... | B60L 53/66 |
| 2019/0146574 | A1* | 5/2019 | Jung | ..................... | G06F 1/3287 713/323 |
| 2019/0187211 | A1* | 6/2019 | Müller | .................... | H02J 7/345 |
| 2020/0247260 | A1* | 8/2020 | Moriya | ................. | B60L 53/305 |
| 2020/0295592 | A1* | 9/2020 | Lei | ......................... | H02J 7/0031 |
| 2020/0395634 | A1* | 12/2020 | Hu | .......................... | B64C 39/024 |
| 2021/0097840 | A1* | 4/2021 | Krishnakumar | ........ | H04W 4/38 |
| 2021/0135489 | A1* | 5/2021 | Stites-Clayton | .. | H02J 13/00004 |
| 2021/0151270 | A1* | 5/2021 | King | ..................... | H01H 47/22 |
| 2022/0115884 | A1* | 4/2022 | Wang | .................... | H02M 1/008 |
| 2022/0131317 | A1* | 4/2022 | Chen | .................... | B60L 53/11 |
| 2023/0032852 | A1* | 2/2023 | Wang | .................. | H02H 11/002 |
| 2024/0178665 | A1* | 5/2024 | Nook | ...................... | F02N 11/14 |

FOREIGN PATENT DOCUMENTS

| | | |
|---|---|---|
| CN | 106383479 | 2/2017 |
| CN | 207460126 | 6/2018 |
| CN | 110601141 | 12/2019 |
| CN | 110970978 | 4/2020 |
| CN | 210924256 | 7/2020 |
| CN | 211377585 | 8/2020 |
| CN | 211405528 | 9/2020 |

* cited by examiner

BATTERY SWITCH ON CIRCUIT AND LITHIUM BATTERY

CROSS REFERENCE TO RELATED APPLICATION

This application is a national phase application of PCT International Application No. PCT/CN2020091100, filed May 19, 2020, which is herein incorporated by reference in its entirety.

TECHNICAL FIELD

Embodiments of the present invention relate to lithium battery management technologies, and in particular, to a battery switch on circuit and a lithium battery.

BACKGROUND OF THE INVENTION

In battery-powered applications, it is usually necessary to achieve the purpose of low power consumption by power off. Therefore, it is very important to power on the entire circuit in the case of power off.

A commonly used method is to power on the entire circuit through a battery charging circuit and a power-on switch circuit. However, this method usually involves a large number of hardware parts and a relatively complex hardware circuit, and the reliability of control signal transmission is relatively poor.

SUMMARY OF THE INVENTION

The present invention provides a battery switch on circuit and a lithium battery to realize the normal power-on and communication after an entire circuit is powered off.

In a first aspect, an embodiment of the present invention provides a battery switch on circuit, including a communication control module, a relay, a communication control circuit, a switch, and a communication connection terminal, where the communication control module includes a communication signal terminal, the communication signal terminal of the communication control module is connected to a first contact of the relay, a common contact of the relay is connected to the communication connection terminal, a coil of the relay is powered on to control the common contact and the first contact to be gated and is powered down to control the common contact and a second contact of the relay to be gated, and the communication connection terminal is configured to connect to an upper computer; the switch includes a first terminal, a second terminal, and a control terminal, and a signal from the control terminal of the switch is capable of controlling conduction or disconnection between the first terminal and the second terminal; the first terminal of the switch is connected to a power supply, the second terminal of the switch is connected to a power input terminal, and after the power input terminal is powered on, the coil of the relay is powered on; and the communication control circuit includes a communication input terminal and a control signal output terminal; the signal input terminal is connected to the second contact of the relay, and the control signal output terminal is connected to the control terminal of the switch.

Optionally, the communication control circuit includes an optocoupler, a first resistor, and a first metal-oxide-semiconductor (MOS) transistor, and the communication input terminal includes a first communication input terminal and a second communication input terminal; and a first input terminal of the optocoupler is electrically connected to the first communication input terminal, a second input terminal of the optocoupler is electrically connected to the second communication input terminal, a first output terminal of the optocoupler is connected to a power supply terminal, a second output terminal of the optocoupler is electrically connected to a gate of the first MOS transistor, a first electrode of the first MOS transistor is grounded, a second electrode of the first MOS transistor is connected to the control terminal of the switch, a first terminal of the first resistor is grounded, and a second terminal of the first resistor is connected to the second output terminal of the optocoupler.

Optionally, the communication control circuit further includes a first diode, a positive electrode of the first diode is connected to the second output terminal of the optocoupler, and a negative electrode of the first diode is connected to the gate of the first MOS transistor.

Optionally, the communication control circuit further includes a second resistor, a third resistor, a fourth resistor, and a fifth resistor, a first terminal of the second resistor is electrically connected to the first communication input terminal, a second terminal of the second resistor is electrically connected to the first input terminal of the optocoupler, the third resistor is connected between the first input terminal and the second input terminal of the optocoupler, a first terminal of the fourth resistor is connected to the second electrode of the first MOS transistor, a second terminal of the fourth resistor is connected to the control terminal of the switch, a first terminal of the fifth resistor is connected to the second terminal of the fourth resistor, and a second terminal of the fifth resistor is connected to a power supply terminal.

Optionally, the switch is a second MOS transistor, a gate of the second MOS transistor is the control terminal of the switch, a first electrode of the second MOS transistor is the first terminal of the switch, and a second electrode of the second MOS transistor is the second terminal of the switch.

Optionally, the battery switch on circuit further includes a third MOS transistor, a sixth resistor, and a seventh resistor, where the sixth resistor and the seventh resistor are connected in series, a first terminal of the sixth resistor is connected to the power input terminal, a second terminal of the sixth resistor is connected to a first terminal of the seventh resistor, a second terminal of the seventh resistor is grounded, the second terminal of the sixth resistor is connected to a gate of the third MOS transistor, a first electrode of the third MOS transistor is grounded, a second electrode of the third MOS transistor is connected to a first terminal of the coil of the relay, and the power input terminal is connected to a second terminal of the coil of the relay.

Optionally, the battery switch on circuit further includes an eighth resistor and a second diode, where a first terminal of the eighth resistor is connected to the power input terminal, a second terminal of the eighth resistor is connected to the second terminal of the coil of the relay, a positive electrode of the second diode is connected to the second electrode of the third MOS transistor, and a negative electrode of the second diode is connected to the power input terminal.

Optionally, the communication connection terminal is a 485 communication connection terminal.

Optionally, the common contact includes a first common contact and a second common contact, the communication connection terminal includes a first communication connection terminal and a second communication connection terminal, the first communication connection terminal is connected to the first common contact, and the second communication connection terminal is connected to the second common contact; the communication signal terminal includes a first communication signal terminal and a second communication signal terminal, the first contact includes a first A contact and a first B contact, and the coil of the relay being powered on to control the common contact and the first contact to be gated includes: the first communication signal terminal being connected to the first A contact, and the second communication signal terminal being connected to the first B contact; and the communication input terminal includes a first communication input terminal and a second communication input terminal, the second contact includes a second A contact and a second B contact, and that the coil of the relay is powered down to control the common contact and the second contact of the relay to be gated includes: the first communication input terminal is connected to the second A contact, and the second communication input terminal is connected to the second B contact.

In a second aspect, an embodiment of the present invention provides a lithium battery, including the battery switch on circuit according to the first aspect.

The present invention provides a battery switch on circuit. The circuit includes a communication control module, a relay, a communication control circuit, a switch, and a communication connection terminal. The communication control module includes a communication signal terminal. The communication signal terminal of the communication control module is connected to a first contact of the relay. A common contact of the relay is connected to the communication connection terminal. A coil of the relay is powered on to control the common contact and the first contact to be gated and is powered down to control the common contact and a second contact of the relay to be gated. The communication connection terminal is configured to connect to an upper computer. The switch includes a first terminal, a second terminal, and a control terminal. A signal from the control terminal of the switch is capable of controlling conduction or disconnection between the first terminal and the second terminal. The first terminal of the switch is connected to the power supply, the second terminal of the switch is connected to a power input terminal, and after the power input terminal is powered on, the coil of the relay is powered on. The communication control circuit includes a communication input terminal and a control signal output terminal. The signal input terminal is connected to the second contact of the relay, and the control signal output terminal is connected to the control terminal of the switch. It can be seen that the foregoing solution can first realize power on of the entire circuit and then realize normal communication by using the communication control module in the case that the entire circuit is powered off. This solves the problems in the prior art of a large number of hardware parts involved, a relatively complex hardware circuit, and relatively poor reliability of control signal transmission, and realizes an effect of normal power-on and communication after the entire circuit is powered off.

DETAILED DESCRIPTION OF THE PREFERRED EMBODIMENTS

Figure 1:
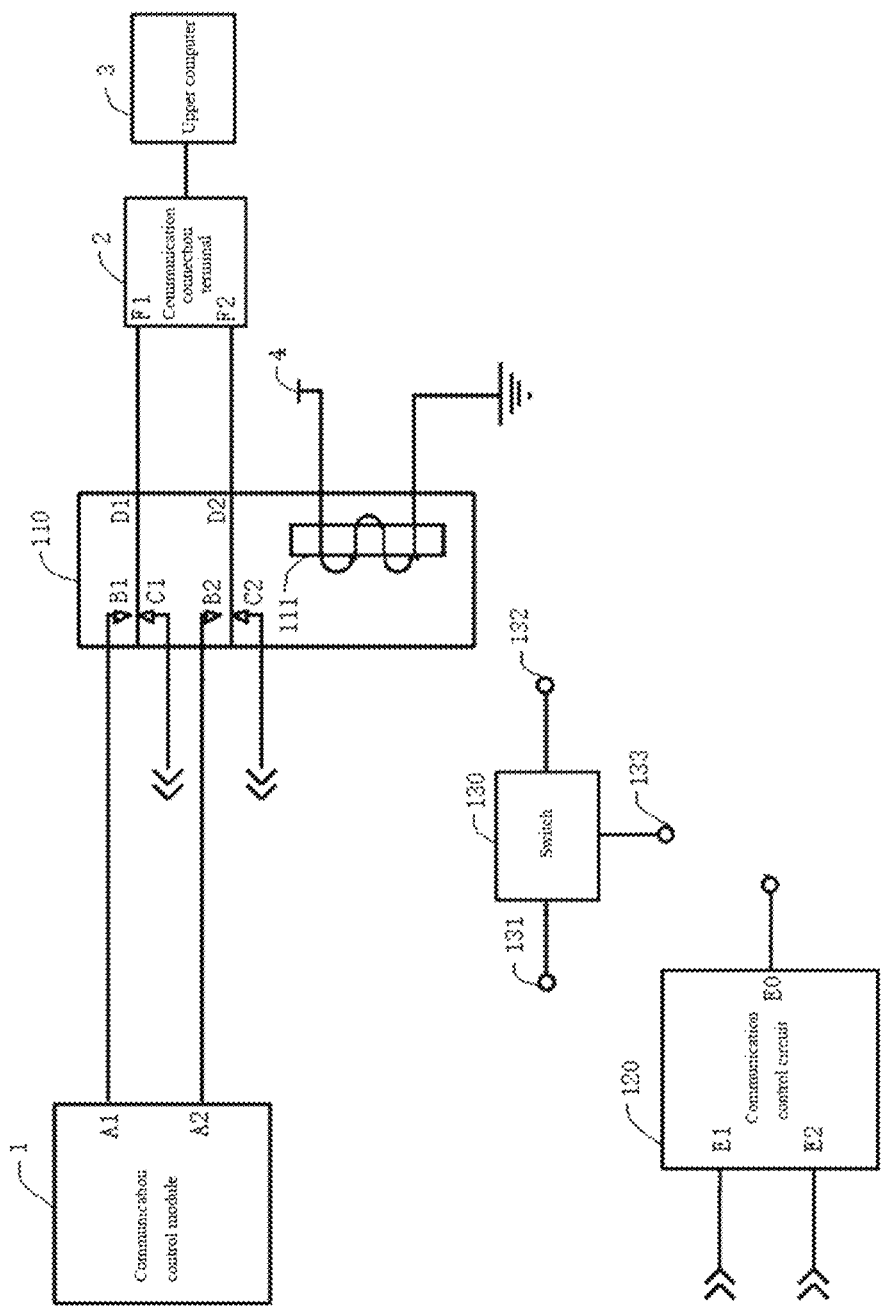
FIG. 1 is a circuit diagram of a battery switch on circuit in Embodiment 1 of the present invention.

The present invention is further described in detail with reference to the drawings and embodiments. It can be understood that the specific embodiments described herein are only used for explaining the present invention, and are not intended to limit the present invention. In addition, it should be noted that for the convenience of description, only some but not all structures related to the present invention are shown in the drawings.

Embodiment 1

FIG. 1 is a circuit diagram of a battery switch on circuit provided in Embodiment 1 of the present invention. Referring to FIG. 1, the circuit includes a communication control module 1, a relay 110, a communication control circuit 120, a switch 130, and a communication connection terminal 2.

The communication control module 1 includes a communication signal terminal. The communication signal terminal of the communication control module 1 is connected to a first contact of the relay 110. A common contact of the relay 110 is connected to the communication connection terminal 2. A coil 111 of the relay 110 is powered on to control the common contact and the first contact to be gated and is powered down to control the common contact and a second contact of the relay 110 to be gated. The communication connection terminal 2 is configured to connect to an upper computer 3.

The switch 130 includes a first terminal 131, a second terminal 132, and a control terminal 133. A signal from the control terminal 133 of the switch 130 is capable of controlling conduction or disconnection between the first terminal 131 and the second terminal 132. The first terminal 131 of the switch 130 is connected to the power supply, the second terminal 132 of the switch 130 is connected to a power input terminal 4, and after the power input terminal 4 is powered on, the coil 111 of the relay 110 is powered on.

The communication control circuit 120 includes a communication input terminal and a control signal output terminal E0. The signal input terminal is connected to the second contact of the relay 110, and the control signal output terminal E0 is connected to the control terminal 133 of the switch 130.

The communication control module 1 may be an RS485 chip.

Optionally, the common contact includes a first common contact D1 and a second common contact D2. The communication connection terminal 2 includes a first communication connection terminal F1 and a second communication connection terminal F2. The first communication connection terminal F1 is connected to the first common contact D1, and the second communication connection terminal F2 is connected to the second common contact D2.

The communication signal terminal includes a first communication signal terminal A1 and a second communication signal terminal A2. The first contact includes a first A contact B1 and a first B contact B2. That the coil 111 of the relay 110 is powered on to control the common contact and the first contact to be gated includes: the first communication signal terminal A1 is connected to the first A contact B1, and the second communication signal terminal A2 is connected to the first B contact B2.

The communication input terminal includes a first communication input terminal E1 and a second communication input terminal E2. The second contact includes a second A contact C1 and a second B contact C2. That the coil 111 of relay 110 is powered down to control the common contact and the second contact of the relay 110 to be gated includes: the first communication input terminal E1 is connected to the second A contact C1, and the second communication input terminal E2 is connected to the second B contact C2.

When the coil 111 of the relay is in a power-down state, the common contact and the second contact of the relay 110 are gated, that is, the first common contact D1 and the second common contact D2 are respectively gated with the second A contact C1 and the second B contact C2, so that the first common contact D1 is connected to the first communication input terminal E1, and the second common contact D2 is connected to the second communication input terminal E2. In this case, a signal from the upper computer 3 may be transmitted to the first communication input terminal E1 and the second communication input terminal E2 of the communication control circuit through the second A contact C1 and the second B contact C2. When the coil 111 of the relay is powered on and pulled in, the common contact of relay 110 is disconnected from the second contact, that is, the first common contact D1 and the second common contact D2 are respectively disconnected from the second A contact C1 and the second B contact C2, and the common contact and the first contact are gated, that is, the first common contact D1 and the second common contact D2 are respectively gated with the first A contact B1 and the first B contact B2, so that the first common contact D1 is connected to the first communication signal terminal A1, and the second common contact D2 is connected to the second communication signal terminal A2, to make the communication control module 1 work. In this case, a signal from the upper computer 3 may be transmitted to the first communication signal terminal A1 and the second communication signal terminal A2 of the communication control module 1 through the first A contact B1 and the first B contact B2, to control the normal communication.

In the technical solution of this embodiment, referring to FIG. 1, an implementation process of the battery switch on circuit is as follows: For example, the battery may supply power for the entire circuit. When the entire circuit needs to be powered on, a power key is pressed, or a high-level signal is transmitted from the upper computer 3. For example, the upper computer continuously transmits a sequence of 1111111111111, where 1 means a high level. In this case, the coil 111 of relay 110 is still in the power-down state, so the common contact is gated with the second contact and is disconnected from the first contact, that is, the second A contact C1 of the second contact is connected to the first communication input terminal E1, and the second B contact C2 is connected to the second communication input terminal E2, so that the high-level signal from the upper computer is inputted to the communication control circuit 120 to make the communication control circuit work and to control the communication control circuit 120 to output a first control signal. The first control signal outputted by the communication control circuit 120 causes the first terminal 131 and the second terminal 132 of the switch 130 to be in conduction with each other, so that a supply voltage is generated at the power input terminal 4, that is, the entire circuit is powered on successfully. After the power-on, the supply voltage generated by the power input terminal 4 causes the coil 111 of relay 110 to be powered on and pulled in. The power on and pull in of the coil 111 causes the common contact and the second contact of the relay 110 to be disconnected from each other so that the second A contact C1 of the second contact is disconnected from the first communication input terminal E1 and the second B contact C2 is disconnected from the second communication input terminal E2, and also causes the common contact and the first contact of the relay 110 to be gated with each other so that the first A contact B1 of the first contact is connected to the first communication signal terminal A1 and the first B contact B2 is connected to the second communication signal terminal A2. In this way, the upper computer can communicate with the communication control module normally.

The technical solution of this embodiment provides a battery switch on circuit. The circuit includes a communication control module, a relay, a communication control circuit, a switch, and a communication connection terminal. The communication control module includes a communication signal terminal. The communication signal terminal of the communication control module is connected to a first contact of the relay. A common contact of the relay is connected to the communication connection terminal. A coil of the relay is powered on to control the common contact and the first contact to be gated and is powered down to control the common contact and a second contact of the relay to be gated. The communication connection terminal is configured to connect to an upper computer. The switch includes a first terminal, a second terminal, and a control terminal. A signal from the control terminal of the switch is capable of controlling conduction or disconnection between the first terminal and the second terminal. The first terminal of the switch is connected to the power supply, the second terminal of the switch is connected to a power input terminal, and after the power input terminal is powered on, the coil of the relay is powered on. The communication control circuit includes a communication input terminal and a control signal output terminal. The signal input terminal is connected to the second contact of the relay, and the control signal output terminal is connected to the control terminal of the switch. It can be seen that the foregoing solution can first realize power on of the entire circuit and then realize normal communication by using the communication control module in the case that the entire circuit is powered off. This solves the problems in the prior art of a large number of hardware parts involved, a relatively complex hardware circuit, and relatively poor reliability of control signal transmission, and realizes an effect of normal power-on and communication after the entire circuit is powered off.

Embodiment 2

Figure 2:
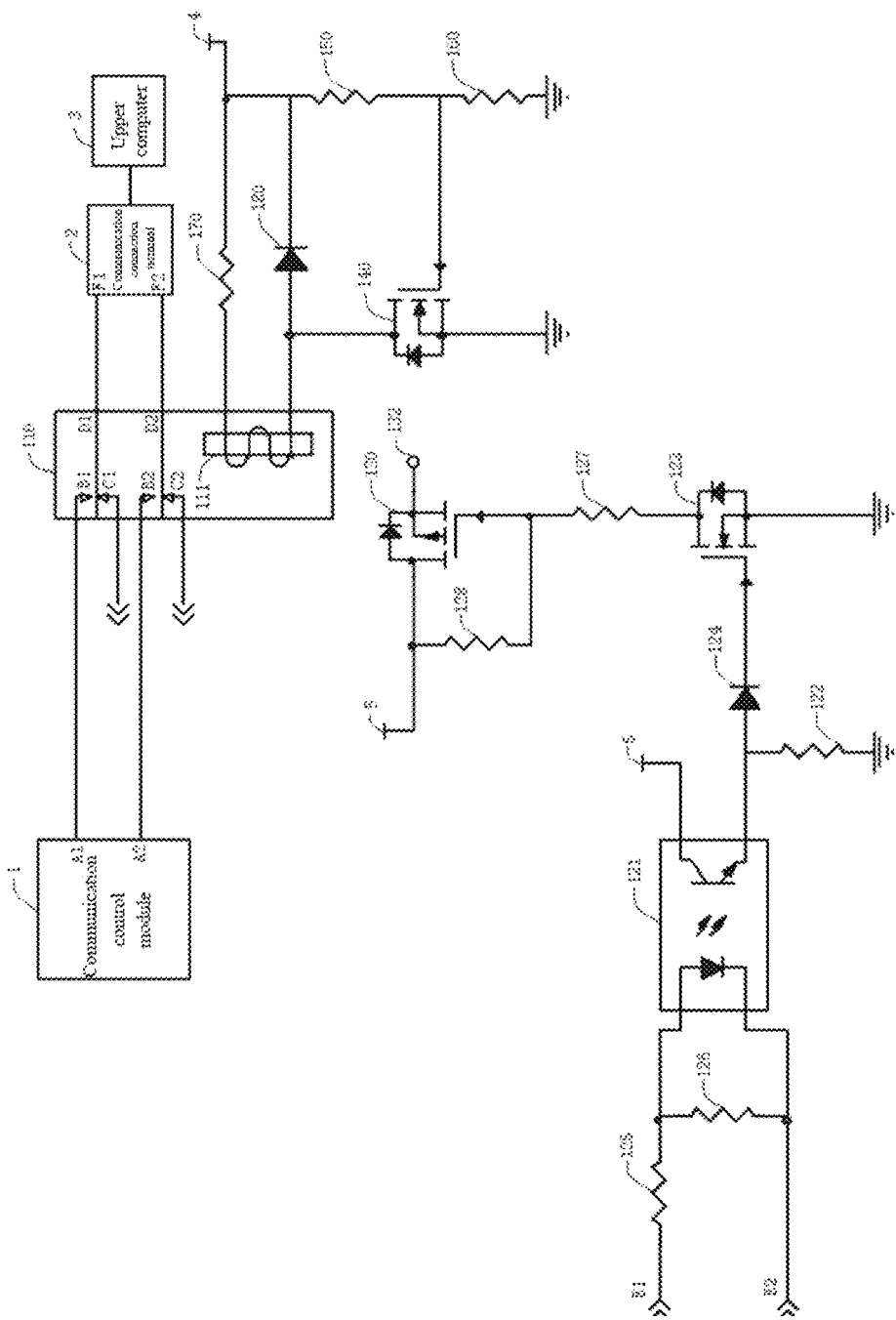
FIG. 2 is a circuit diagram of a battery switch on circuit in Embodiment 2 of the present invention.

FIG. 2 is a circuit diagram of a battery switch on circuit provided in Embodiment 2 of the present invention. Based on the foregoing technical solution, referring to FIG. 2, the communication control circuit includes an optocoupler 121, a first resistor 122, and a first MOS transistor 123, and the communication input terminal includes a first communication input terminal E1 and a second communication input terminal E2. A first input terminal of the optocoupler 121 is electrically connected to the first communication input terminal E1, a second input terminal of the optocoupler 121 is electrically connected to the second communication input terminal E2, a first output terminal of the optocoupler 121 is connected to a power supply terminal 5, a second output terminal of the optocoupler 121 is electrically connected to a gate of the first MOS transistor 123, a first electrode of the first MOS transistor 123 is grounded, a second electrode of the first MOS transistor 123 is connected to the control terminal 131 of the switch 130, a first terminal of the first resistor 122 is grounded, and a second terminal of the first resistor 122 is connected to the second output terminal of the optocoupler 121.

The optocoupler 121 may be a PC817 optocoupler, and is configured to transmit an electrical signal received by the communication input terminal through electrical-optical-electrical conversion, to ensure the reliability of electrical signal transmission.

Optionally, the communication control circuit further includes a first diode 124. A positive electrode of the first diode 124 is connected to the second output terminal of the optocoupler 121, and a negative electrode of the first diode 124 is connected to the gate of the first MOS transistor 123.

The first diode 124 is configured for isolation.

Optionally, the communication control circuit further includes a second resistor 125, a third resistor 126, a fourth resistor 127, and a fifth resistor 128. A first terminal of the second resistor 125 is electrically connected to the first communication input terminal E1. A second terminal of the second resistor 125 is electrically connected to the first input terminal of the optocoupler 121. The third resistor 126 is connected between the first input terminal and the second input terminal of the optocoupler 121. A first terminal of the fourth resistor 127 is connected to the second electrode of the first MOS transistor 123. A second terminal of the fourth resistor 127 is connected to the control terminal of the switch 130. A first terminal of the fifth resistor 128 is connected to the second terminal of the fourth resistor 127. A second terminal of the fifth resistor 128 is connected to the power supply terminal 4.

The second resistor 125 and the third resistor 126 are configured for voltage division. The first MOS transistor may be an NPN-type MOS transistor, which conducts when a high level signal is inputted.

Optionally, the switch 130 is a second MOS transistor. A gate of the second MOS transistor is the control terminal of the switch, a first electrode of the second MOS transistor is the first terminal of the switch, and a second electrode of the second MOS transistor is the second terminal of the switch.

The second MOS transistor may be a PNP-type MOS transistor, which conducts when a low level signal is inputted.

For example, the process of the communication input terminal causing the switch 130 to conduct after receiving a control signal from the upper computer 3 is as follows. Referring to FIG. 2, when power on is required, the upper computer 3 generates a high-level signal. In this case, the common contact and the second contact of the relay 110 are connected to each other, the high-level signal is transmitted to the communication input terminal through the second contact, and after being subjected to voltage division by the second resistor 125 and the third resistor 126, is then transmitted to the optocoupler 121. The optocoupler 121 conducts, and outputs a high-level signal. The outputted high-level signal is transmitted to the gate of the first MOS transistor through the third resistor 122 and the first diode 124 to cause the first MOS transistor 123 to conduct, and the first MOS transistor 123 outputs a low-level signal, that is, pulls down the potential at the gate of the second MOS transistor to cause the second MOS transistor 130 to conduct. The first electrode of the second MOS transistor 130 is connected to the power supply terminal 5, the first electrode and the second electrode of the second MOS transistor 130 are in conduction with each other, and the second electrode of the second MOS transistor is supplied with power, that is, the power-on is successful.

Optionally, the battery switch on circuit further includes a third MOS transistor 140, a sixth resistor 150, and a seventh resistor 160. The sixth resistor 150 and the seventh resistor 160 are connected in series. A first terminal of the sixth resistor 150 is connected to the power input terminal 4. A second terminal of the sixth resistor 150 is connected to a first terminal of the seventh resistor 160. A second terminal of the seventh resistor 160 is grounded. The second terminal of the sixth resistor 150 is connected to a gate of the third MOS transistor 140. A first electrode of the third MOS transistor 140 is grounded. A second electrode of the third MOS transistor 140 is connected to the first terminal of the coil 111 of the relay. The power input terminal 4 is connected to the second terminal of the coil 111 of the relay.

The process of pulling in the coil of the relay is as follows: For example, referring to FIG. 1 and FIG. 2, when the first terminal 131 and the second terminal 132 of switch 130 are in conduction with each other, a supply voltage is generated at the power input terminal 4 which passes through the sixth resistor 150 and the seventh resistor 160 and causes the gate of the third MOS transistor 140 to conduct, so that the coil 111 of the relay is powered on and pulled in.

Optionally, the battery switch on circuit further includes an eighth resistor 170 and a second diode 180. A first terminal of the eighth resistor 170 is connected to the power input terminal 4. A second terminal of the eighth resistor 170 is connected to the second terminal of the coil 111 of the relay. A positive electrode of the second diode 180 is connected to the second electrode of the third MOS transistor 140. A negative electrode of the second diode 180 is connected to the power input terminal 4.

Optionally, the communication connection terminal is a 485 communication connection terminal.

An implementation process of the battery switch on circuit is as follows: For example, referring to FIG. 1 and FIG. 2, when the entire circuit needs to be powered on, the upper computer 3 generates a high-level signal. In this case, because the relay 110 is in the power-down state and the common contact and the second contact of the relay 110 are connected to each other, the high-level signal is transmitted to the communication input terminal through the second contact, and after being subjected to voltage division by the second resistor 125 and the third resistor 126, is transmitted to the optocoupler 121. The optocoupler 121 outputs a signal which is still at a high level. The signal is then transmitted to the first MOS transistor 123 through the first resistor 122 and the first diode 124, to cause the first MOS transistor 123 to conduct. The first MOS transistor 123 conducts, and outputs a low-level signal to causes the second MOS transistor 130 to conduct so as to power on the entire circuit. After the entire circuit is powered on, a supply voltage is outputted, that is, a supply voltage is generated at the power input terminal 4. The supply voltage passes through the sixth resistor 150 and the seventh resistor 160 and causes the third MOS transistor 140 to conduct. The conducting of the third MOS transistor 140 causes the coil 111 of the relay to be powered on and pulled in. The power on of the coil 111 causes the common contact to be disconnected from the second contact, and also causes the common contact to be gated with the first contact, so that the first contact is connected to the communication signal terminal of the communication control module 1. In this way, the communication control module 1 works and performs a normal communication function. The foregoing solution can first realize power on of the entire circuit and then realize normal communication by using the communication control module in the case that the entire circuit is powered off.

Embodiment 3

An embodiment of the present invention further provides a lithium battery, including the battery switch on circuit according to any embodiment of the present invention.

The lithium battery may be a rechargeable lithium battery. The lithium battery may be applicable to scenarios requiring use of a battery as a power supply, for example, in electric vehicles, aircrafts, or high-speed rails.

It should be noted that the foregoing description is merely preferred embodiments of the present invention and the technical principles adopted. It will be understood by those skilled in the art that the present invention is not limited to the specific embodiments described herein. For those skilled in the art, various obvious changes, readjustments, and replacements can be made without departing from the protection scope of the present invention. Therefore, although the present invention is described in detail through the foregoing embodiments, the present invention is not limited to the foregoing embodiments, but may also include more other equivalent embodiments as long as they do not depart from the concept of the present invention. The scope of the present invention is subject to the scope of the appended claims.

What is claimed is:

1. A battery switch on circuit, comprising a communication control module, a relay, a communication control circuit, a switch, and a communication connection terminal, the relay comprising a power input terminal, at least one common contact, at least one first contact, at least one second contact, and a coil for controlling a connection between the at least one common contact and the at least one first contact and a connection between the at least one common contact and the at least one second contact based on the voltage at the power input terminal, wherein the communication control module comprises a communication signal terminal, connected to a first contact of the relay, wherein the at least one common contact of the relay is connected to at least one communication connection terminal of the communication connection terminal; wherein the coil of the relay is powered on by a battery power supply at the power input terminal to control a connection between the at least one common contact of the relay and the at least one first contact of the relay, and is powered down by the power input terminal to control a connection between the at least one common contact of the relay and the at least one second contact of the relay; and wherein the communication connection terminal is connected to an upper computer;

the switch comprises a first terminal, a second terminal, and a control terminal for controlling conduction or disconnection between the first terminal and the second terminal, wherein the first terminal of the switch is connected to the battery power supply, wherein the second terminal of the switch is connected to the power input terminal, and wherein after the power input terminal is powered on, the coil of the relay is powered on by the battery power supply; and the communication control circuit comprises at least one communication input terminal and a control output terminal, wherein the at least one communication input terminal is connected to the at least one second contact of the relay, and the control output terminal is connected to the control terminal of the switch, wherein when power on is needed, the switch is configured to receive a signal at the control terminal to cause the first terminal and the second terminal to be in conduction each other.

2. The battery switch on circuit according to claim 1, wherein the communication control circuit comprises an optocoupler, a first resistor, and a first metal-oxide- semiconductor, MOS, transistor, and the at least one communication input terminal comprises a first communication input terminal and a second communication input terminal; and a first input terminal of the optocoupler is electrically connected to the first communication input terminal, a second input terminal of the optocoupler is electrically connected to the second communication input terminal, a first output terminal of the optocoupler is connected to a power supply terminal, a second output terminal of the optocoupler is electrically connected to a gate of the first MOS transistor, a first electrode of the first MOS transistor is grounded, a second electrode of the first MOS transistor is connected to the control terminal of the switch, a first terminal of the first resistor is grounded, and a second terminal of the first resistor is connected to the second output terminal of the optocoupler.

3. The battery switch on circuit according to claim 2, wherein the communication control circuit further comprises a first diode, a positive electrode of the first diode is connected to the second output terminal of the optocoupler, and a negative electrode of the first diode is connected to the gate of the first MOS transistor.

4. The battery switch on circuit according to claim 2, wherein the communication control circuit further comprises a second resistor, a third resistor, a fourth resistor, and a fifth resistor, a first terminal of the second resistor is electrically connected to the first communication input terminal, a second terminal of the second resistor is electrically connected to the first input terminal of the optocoupler, the third resistor is connected between the first input terminal and the second input terminal of the optocoupler, a first terminal of the fourth resistor is connected to the second electrode of the first MOS transistor, a second terminal of the fourth resistor is connected to the control terminal of the switch, a first terminal of the fifth resistor is connected to the second terminal of the fourth resistor, and a second terminal of the fifth resistor is connected to a power supply terminal.

5. The battery switch on circuit according to claim 4, wherein the switch is a second MOS transistor, a gate of the second MOS transistor is the control terminal of the switch, a first electrode of the second MOS transistor is the first terminal of the switch, and a second electrode of the second MOS transistor is the second terminal of the switch.

6. The battery switch on circuit according to claim 5, further comprising a third MOS transistor, a sixth resistor, and a seventh resistor, wherein the sixth resistor and the seventh resistor are connected in series, a first terminal of the sixth resistor is connected to the power input terminal, a second terminal of the sixth resistor is connected to a first terminal of the seventh resistor, a second terminal of the seventh resistor is grounded, the second terminal of the sixth resistor is connected to a gate of the third MOS transistor, a first electrode of the third MOS transistor is grounded, a second electrode of the third MOS transistor is connected to a first terminal of the coil of the relay, and the power input terminal is connected to a second terminal of the coil of the relay.

7. The battery switch on circuit according to claim 6, further comprising an eighth resistor and a second diode, wherein a first terminal of the eighth resistor is connected to the power input terminal, a second terminal of the eighth resistor is connected to the second terminal of the coil of the relay, a positive electrode of the second diode is connected to the second electrode of the third MOS transistor, and a negative electrode of the second diode is connected to the power input terminal.

8. The battery switch on circuit according to claim 1, wherein the communication connection terminal is a 485 communication connection terminal.

9. The battery switch on circuit according to claim 1, wherein the at least one common contact comprises a first common contact and a second common contact, the communication connection terminal comprises a first communication connection terminal and a second communication connection terminal, the first communication connection terminal is connected to the first common contact, and the second communication connection terminal is connected to the second common contact;
- the at least one communication signal terminal comprises a first communication signal terminal and a second communication signal terminal, the first contact comprises a first A contact and a first B contact, and the coil of the relay being powered on to control the connection between the common contact and the first contact comprises: the first communication signal terminal being connected to the first A contact, and the second communication signal terminal being connected to the first B contact; and
- the at least one communication input terminal comprises a first communication input terminal and a second communication input terminal, the second contact comprises a second A contact and a second B contact, and that the coil of the relay is powered down to control the connection between the common contact and the second contact of the relay comprises: the first communication input terminal is connected to the second A contact, and the second communication input terminal is connected to the second B contact.

10. A lithium battery, comprising the battery switch on circuit according to claim 9.

11. The battery switch on circuit according to claim 1, wherein when power on is needed:
- the at least one second contact of the relay is connected to the at least one common contact of the relay, so that the at least one communication connection terminal of the communication connection terminal is connected to the at least one communication input terminal of the communication control circuit;
- the communication control circuit is configured to receive, from the communication connection terminal, a signal at the at least one communication input terminal and generate therefrom the signal at the control output terminal to cause the first terminal and the second terminal of the switch to be in conduction each other;
- the switch is configured to receive the signal at the control terminal and to connect the first terminal and the second terminal, so that the battery power supply is generated at the power input terminal of the relay:
- the coil is configured to receive the battery power supply and it is powered-on, so that the at least one second contact is disconnected from the at least one common contact of the relay and the at least one common contact is connected to the at least one first contact, so that the upper computer is adapted to communicate with the communication control module.

* * * * *